United States Patent [19]

Naito et al.

[11] Patent Number: 5,776,792

[45] Date of Patent: Jul. 7, 1998

[54] METHOD FOR FORMING SEMICONDUCTOR LASER DEVICE

[75] Inventors: Hiroki Naito, Osaka; Masahiro Kume, Siga, both of Japan

[73] Assignee: Matsushita Electronics Corporation, Osaka, Japan

[21] Appl. No.: 811,439

[22] Filed: Mar. 3, 1997

Related U.S. Application Data

[62] Division of Ser. No. 417,396, Apr. 5, 1995, Pat. No. 5,646,953.

[30] Foreign Application Priority Data

Apr. 6, 1994 [JP] Japan ................................ 6-068545
Jul. 14, 1994 [JP] Japan ................................ 6-161998

[51] Int. Cl.$^6$ ........................................ H01L 21/00
[52] U.S. Cl. ........................ 438/31; 438/37; 438/39; 438/46
[58] Field of Search ............................ 438/31, 37, 39, 438/40, 43, 44, 45, 46

[56] References Cited

U.S. PATENT DOCUMENTS

| | | | |
|---|---|---|---|
| 5,321,712 | 6/1994 | Itaya et al. | 372/43 |
| 5,331,656 | 7/1994 | Tamaka | 372/45 |
| 5,386,429 | 1/1995 | Naito et al. | 372/46 |
| 5,446,953 | 9/1995 | Naito et al. | 372/46 |
| 5,466,950 | 11/1995 | Sugawara et al. | 257/94 |
| 5,574,743 | 11/1996 | Van Der Poel et al. | 372/46 |

*Primary Examiner*—John Niebling
*Assistant Examiner*—Long Pham
*Attorney, Agent, or Firm*—McDermott, Will & Emery

[57] ABSTRACT

On an n-type semiconductor substrate, a buffer layer and a cladding layer are formed. On the cladding layer, an active layer made of $Ga_{1-x}Al_xAs$ is formed. On the active layer, an n-type first optical guiding layer made of $Ga_{1-Y1}Al_{Y1}As$ is formed, and on the first optical guiding layer, an n-type second optical guiding layer made of $Ga_{1-Y2}Al_{Y2}As$ is formed in stripe. On the first optical guiding layer and the second optical guiding layer, an n-type cladding layer made of $Ga_{1-Y3}Al_{Y3}As$ is formed. The interface resistance between the first optical guiding layer and the cladding layer is larger than both the interface resistance between the first optical guiding layer and the second optical guiding layer and the interface resistance between the second optical guiding layer and the cladding layer. Between X, Y1, Y2, and Y3 of each AlAs mole fraction of the active layer, first and second optical guiding layers, and cladding layer, the relationships of $Y3>Y2$ and $Y1>X \geq 0$ are satisfied.

6 Claims, 8 Drawing Sheets

METHOD FOR FORMING SEMICONDUCTOR LASER DEVICE

This is a divisional of application Ser. No. 08/417,396, filed Apr. 5, 1995 now U.S. Pat. No. 5,646,953.

BACKGROUND OF THE INVENTION

The present invention relates to a high-yield semiconductor laser device of real refractive index-guided structure operating at low current value, which is highly suitable for a light source for use in optical information processing and the like, and a method of the production thereof.

Below, conventional semiconductor laser devices will now be described.

As a light source for use in information processing of optical communication, optical disk, and the like, a single-mode light source is required, and hence semiconductor lasers with index-guided structure are employed. Especially, in recent years, a semiconductor laser device formed by means of metal organic chemical vapor deposition (MOCVD) or molecular beam epitaxy (MBE) excellent in film thickness uniformity as a crystal growth technique has been mainstream.

Below, a description will now be given to conventional semiconductor laser devices with index-guided structure which are implementable by a vapor phase growth technique. FIGS. 9 to 13 are sectional schematic diagrams of typical conventional semiconductor laser devices with index-guided structure. In the drawings, electrode layers formed on the top and bottom faces of each semiconductor substrate are omitted.

FIG. 9 shows a semiconductor laser device used in applications to optical disks including a CD (See, JJAP, vol. 24, p.L89 (1985)). Referring to FIG. 9, on an n-type semiconductor substrate 11 made of gallium arsenide (GaAs), is formed an n-type cladding layer 12 made of gallium aluminum arsenide (GaAlAs). On the cladding layer 12, is formed an active layer 13 made of GaAlAs. On the active layer 13, is formed a p-type first cladding layer 14 made of GaAlAs. At the region other than a stripe region 15a serving as a current channel on the first cladding layer 14, is formed an n-type current blocking layer 15 made of GaAs for current confinement. On the first cladding layer 14 and current blocking layer 15, is formed a p-type second cladding layer 16A made of GaAlAs by an epitaxial growth technique. On the second cladding layer 16A, is formed a p-type contact layer 17 made of GaAs.

In a semiconductor device of this structure, the electric current injected from the contact layer 17 is effectively confined within the stripe region 15a due to the presence of the current blocking layer 15. This causes laser oscillation in the active layer 13 underneath the stripe region 15a. In this structure, the energy band gap of the current blocking layer 15 is smaller than the energy of wavelength of the laser light. Therefore, the laser light outside the stripe region 15a is absorbed in the current blocking layer 15. Consequently, the laser light is effectively confined within the stripe region 15a, resulting in a single-mode laser oscillation.

In the semiconductor laser device shown in FIG. 10, on an n-type semiconductor substrate 11, is formed an n-type cladding layer made of GaAlAs. On the cladding layer 12, is formed an active layer 13 made of GaAlAs. On the active layer 13, is formed a striped p-type cladding layer 16B. In the region other than the stripe region on the cladding layer 16B, a n-type current blocking layer 15 is formed, while a p-type cap layer 18 made of GaAs is formed on the stripe region on the cladding layer 16B. On the current blocking layer 15 and cap layer 18, is formed a p-type contact layer 17 made of GaAs.

The basic principle of operation of the semiconductor laser device shown in FIG. 10 is the same as that of the semiconductor laser device shown in FIG. 9. The presence of the current blocking layer 15 causes electric current and laser light to be confined within the stripe region, resulting in a single-mode laser oscillation (See, JJAP, vol.25, p.L498 (1986)).

The semiconductor laser device shown in FIG. 11 has a construction obtained by simplifying the semiconductor laser device shown in FIG. 10, and it has a ridge waveguide structure in which the current blocking layer 15 is not formed (See, SPIE, vol. 1043, p.61 (1989)). In this device, the reference numeral 19 in FIG. 11 denotes a dielectric film. The semiconductor laser device shown in FIG. 11 has problems of the occurrence of crack on cleavage, an increase in thermal resistance, and the like, due to the unevenness of its surface, and hence has not gone into mass production, whereas the device so constructed that its surface is flattened shown in FIG. 10 has found widespread application. In other words, the current blocking layer 15 also has an effect of flattening the surface of the semiconductor laser device to enhance the productivity in large quantity.

In recent years, there has also been developed a semiconductor laser of real refractive index-guided structure employing a GaAlAs current blocking layer (Japanese Laid-Open Patent Publication No. 62-73687). With this structure, a current blocking layer is formed so as to have a lower refractive index than that of a cladding layer, resulting in the confinement of laser light within a stripe region. Accordingly, unlike the devices of the constructions shown in FIGS. 9 and 10 in which laser light is confined by light absorption of the current blocking layer 15, a single-mode semiconductor laser device operating at low current value can be obtained due to low internal loss.

FIG. 12 illustrates a semiconductor laser device of a buried hetero (BH) structure applied to the field of optical communications and the like (See, IEEE, J. Quantum Electron., QE-16, p205 (1980)). Referring to FIG. 12, the reference numerals 20 and 21 indicate a high-resistivity layer and a zinc diffusion region, respectively. In the semiconductor laser device shown in FIG. 12, the high-resistivity layer 20 on both sides of the active layer 13 serves as a current blocking layer, which causes abrupt confinement of laser light within the stripe region due to the difference in refractive index between the active layer 13 and high-resistivity layer 20. Abrupt optical confinement increases the optical density in the active layer 13. Therefore, this structure is inadequate to obtain high output power, and hence commonly applied to low output power semiconductor laser devices in practice use.

FIG. 13 illustrates an example of conventional devices wherein on a cladding layer 12 is formed an optical guiding layer 22, and on the optical guiding layer 22 is formed a striped active layer 13 (See, IEEE, J. Quantum Electron., QE-15, p451 (1979)). The semiconductor laser device of this structure has a disadvantage in that when the active layer 13 is etched in stripe, the active layer 13 is exposed in air to cause reliability degradation. Also, a current blocking layer 23 made of GaAlAs is formed on the uppermost surface of grown layers, resulting in broad spread of current. This entails a problem of raising the threshold value, not yet leading to the practical application thereof.

On the other hand, there has been a demand for a semiconductor laser device which causes blue laser light to oscillate as a light source for high density information recording adaptable to a multimedia. However, a practical semiconductor laser device which causes blue laser light to oscillate has not yet been implemented.

As one of the materials for implementing this semiconductor laser device, a semiconductor material of the GaN system whereby, for example, an active layer is made of InGaN has attracted attention. However, the semiconductor material of the GaN system has high atomic bond strength as compared with GaAs or the like, and hence it is difficult to be etched.

As described above, semiconductor laser devices of conventional structures are so constructed that current and laser light are confined into a stripe by the use of a current blocking layer. Therefore, in producing the semiconductor laser devices, a step for etching a current blocking layer in stripe, or a step for selectively forming a current blocking layer outside the stripe region is indispensable.

As the thickness of a current blocking layer required for blocking injection current, approximately the diffusion length for electrons or holes is necessary. Therefore, an n-type current blocking layer made of GaAs is required to have a thickness of about at least 0.5 to 1 μm, while a p-type current blocking layer made of GaAs is required to have a thickness of at least 2 to 3 μm. In producing a semiconductor laser device, the thinner a current blocking layer is, the easier the production thereof becomes. Accordingly, an n-type current blocking layer is employed in practical use. The formation of the n-type current blocking layer requires the etching of a stripe region to a depth of about 1 μm. However, deep etching causes a variation in stripe width after etching, resulting in a lowered yield. The stripe width after etching is required to be controlled to, for example, about 2±0.2 μm in the case of real refractive index-guided structure. In a semiconductor laser device in which light distribution is directly affected by the stripe width, the control of the stripe width is very important.

The problem of controlling a stripe width arises especially when an etching stopping layer is provided in order to each the blocking layer selectively in a direction of depth with stability. This is attributable to, for example, the fact as follows: in FIG. 9, even if an etchant capable of selectively etching the current blocking layer 15 is used, when the thickness of the current blocking layer 15 is large, the film thickness thereof also exhibits a wide range of variation. Therefore, side etching during the time required for removing all the regions to be removed in the current blocking layer 15 causes a wide range of variation in stripe width.

Specifically, when the variation of the thickness of the current blocking layer 15 in a wafer is ±10%, the thickness of the current blocking layer 15 is 1±0.1 μm in the wafer. This results in a variation of ±0.2 μm in stripe width due to side etching even if the etch rates of side etching and of etching in a direction of depth are the same with each other. Actually, the variation in mask width caused by a photolithography process is further added to the above-described variation. This entails a problem that the value of 2±0.2 μm in the above-described example of design cannot be satisfied, resulting in a lowered yield.

As in the construction shown in FIG. 10, even when the current blocking layer 15 is selectively formed outside the stripe region, a process for etching a p-type cladding layer 16B to a thickness of 1 μm is required, resulting in the same difficulty in controlling of stripe width as that described above. In other words, as long as the current blocking layer 15 is necessary, the problem of controlling stripe width by deep etching cannot be avoided. However, in the construction shown in FIG. 9, a process of selectively growing the current blocking layer 15 on the first cladding layer 14 can be considered as the production process. This requires the following steps. That is, prior to selective growth, a dielectric film such as nitride film serving as a mask for selective growth is formed on the first cladding layer 14 within the stripe region 15a by means of a technique such as plasma-activated chemical vapor deposition (PCVD). After selective growth, the above-described dielectric film is removed by means of a technique such as reactive ion etching. These steps entail problems of causing a large quantity of crystal defect to be introduced in the first cladding layer 14 in close to the light emitting region of the active layer 13, and complicating the production method, thereby not yet leading to the implementation.

On the other hand, as one of the materials for implementing a semiconductor laser device which emits blue laser light, semiconductor materials of the GaN system whereby, for example, an active layer is made of InGaN has attracted attention. However, the semiconductor material of the GaN system has high atomic bond strength as compared with GaAs or the like, and hence it is difficult to be etched. This is one of the causes for preventing the implementation of the semiconductor laser device. That is, the formation of waveguide in the inside of the semiconductor laser device requires etching by means of wet etching technique which will not cause damage to crystal. However, an etchant suitable for use in this step has not yet been found.

Even if there is a suitable etchant, there occurs a problem as follows: the GaN crystal epitaxial growth is generally of hexagonal system unlike crystal of the cubic system such as GaAs system. When subjected to deep etching required for the above-described conventional constructions, the etched surface becomes uneven. This leads to large loss in waveguide, resulting in no possibility of laser oscillation. Therefore, even if etching is performed, there is a limitation that only extremely shallow etching is allowed.

SUMMARY OF THE INTENTION

The present invention has been achieved in view of the above-described disadvantages and deficiencies of the prior art semiconductor laser devices. It is therefore an object of the present invention to provide a single-mode semiconductor laser device having a flat surface without the use of a current blocking layer with ease and reliability. It is still more specific object of this invention to provide a semiconductor laser device emitting blue laser light with ease.

To attain the above-described objects, according to the present invention, by making the resistance of the stripe region low, while making the resistance outside the stripe region high, a structure in which electric current flows only through the stripe region is provided, implementing a semiconductor laser device having an index-guided structure despite no presence of a current blocking layer.

A first semiconductor laser device in accordance with the present invention comprises an active layer having a refractive index of $n_X$; a first semiconductor layer of one conductivity type having a refractive index of $n_{y1}$ formed on the active layer; a second semiconductor layer of one conductivity type having a refractive index of $n_{y2}$ formed in stripe on the first semiconductor layer; and a third semiconductor layer of one conductivity type having a refractive index of $n_{y3}$ formed on the first semiconductor layer and the second semiconductor layer; wherein the interface resistance between the first semiconductor layer and the third semiconductor layer is larger than both the interface resistance between the first semiconductor layer and the second semiconductor layer, and the interface resistance between the second semiconductor layer and the third semiconductor layer; the refractive index $n_x$ of the active layer is larger than the refractive index $n_{y1}$ of the first semiconductor layer; and the refractive index $n_{y2}$ of the second semiconductor layer is larger than the refractive index $n_{y3}$ of the third semiconductor layer.

According to the first semiconductor device, the interface resistance between the first semiconductor layer and the third semiconductor layer is larger than both the interface resistance between the first semiconductor layer and the second semiconductor layer and the interface resistance between the second semiconductor layer and third semiconductor layer. Therefore, between the first semiconductor layer and the third semiconductor layer, it is difficult for current to flow through the region where the second semiconductor layer is not formed, i.e., the region other than the stripe region. On the other hand, it is easy for current to flow through the region where the second semiconductor layer is formed, i.e., the stripe region. Consequently, even without the formation of a current blocking layer, a second semiconductor layer formed thin and uniformly, for example, by means of a metal organic chemical vapor deposition (MOCVD) can confine current within the stripe region. Accordingly, deep etching for forming a current blocking layer becomes no more necessary, and the formation of the stripe region becomes possible by shallow etching for forming the second semiconductor layer. This can extremely decrease variation in stripe width, implementing a semiconductor laser device of index-guided structure with low cost and high yield.

Also, the refractive index $n_x$ of the active layer is larger than the refractive index $n_{y1}$ of the first semiconductor layer, and the refractive index $n_{y2}$ of the second semiconductor layer is larger than the refractive index $n_{y3}$ of the third semiconductor layer. Therefore, the effective refractive index of the stripe region becomes larger than that of the region other than the stripe region, resulting in stable single transverse mode oscillation at low current value by a real refractive index-guided mechanism.

The semiconductor laser device in accordance with the present invention is very effective in producing a semiconductor laser device of the GaN system which is a material of the hexagonal system difficult to deep etch. The material of the GaN system has a large energy band gap, and is applied to a semiconductor laser device causing the oscillation of blue laser light. Consequently, according to the present invention, a laser light source of the pickup for a high density optical disk recording image information in a high definition TV and the like becomes implementable.

Also, the semiconductor laser device operating at low current value is most suitable as laser light source of the pickup adaptable for all optical disks including a compact disc. Especially, the reduction in operating current value leads to a reduction in the heating value of the laser mount portion, thus enabling the use of smaller and more light-weight heat sink. As a result of this, the resinification of the laser package, which has been metal in the prior art, can be implemented, leading to a large decrease in size and cost of the pickup.

In the first semiconductor laser device, it is preferable that an oxide film is formed at the surface layer of the region in contact with the third semiconductor layer in the first semiconductor layer. Thus, the interface resistance between the first semiconductor layer and the third semiconductor layer can be made large with ease and reproducibly.

A second semiconductor laser device in accordance with the present invention comprises an active layer made of $Ga_{1-x}Al_xAs$; a first optical guiding layer of one conductivity type made of $Ga_{1-y1}Al_{y1}As$ formed on the active layer; a second optical guiding layer of one conductivity type made of $Ga_{1-y2}Al_{y2}As$ formed in stripe on the first optical guiding layer; and a cladding layer of one conductivity type made of $Ga_{1-y3}Al_{y3}As$ formed an the first optical guiding layer and the second optical guiding layer, wherein the interface resistance between the first optical guiding layer and the cladding layer is larger than both the interface resistance between the first optical guiding layer and the second optical guiding layer, and the interface resistance between the second optical guiding layer and the cladding layer; and between X, Y1, Y2, and Y3 of each AlAs mole fraction of the active layer, the first optical guiding layer, the second optical guiding layer, and the cladding layer, the relationships of Y3>Y2, and Y1>X≧0 are satisfied.

According to the second semiconductor laser device, the interface resistance between the first optical guiding layer and the cladding layer is lager than both the interface resistance between the first optical guiding layer and the second optical guiding layer and the interface resistance between the second optical guiding layer and the cladding layer. Therefore, it becomes easy for current to flow through only the region where the second optical guiding layer is formed, i.e., the stripe region. Consequently, even without the formation of a current blocking layer, a second optical guiding layer with thin thickness can confine current within the stripe region. Accordingly, deep etching for forming a current blocking layer becomes no more necessary. This can decrease variation in stripe width, implementing a semiconductor laser device of index-guided structure operating with low cost and high yield.

Also, between X, Y1, Y2, and Y3 of each AlAs mole fraction of the active layer, first optical guiding layer, second optical guiding layer and cladding layer, the relationships of Y3>Y2 and Y1>X≧0 are satisfied. Consequently, the refractive index of the second optical guiding layer becomes larger than the refractive index of the cladding layer. Therefore, the effective refractive index of the stripe region becomes larger than that of the region other than the stripe region, resulting in stable single transverse mode oscillation at low current value.

In the second semiconductor laser device, it is preferable that the second optical guiding layer is transparent to the wavelength of laser light caused to oscillate by the active layer. Thus, the heat generation in close to the active layer is prevented, resulting in higher output power and longer life of the semiconductor laser device.

As one approach for forming transparent second optical guiding layer, in the second semiconductor laser device, it is preferable that between X and Y2 of each AlAs mole fraction of the active layer and the second optical guiding layer, the relationship of Y2>X is satisfied. Thus, the second optical guiding layer becomes transparent to the wavelength of the laser light caused to oscillate by the active layer, thereby preventing the heat generation in close to the active layer.

As another approach for forming transparent second optical guiding layer, in the second semiconductor laser device, it is preferable that between X and Y2 of each AlAs mole fraction of the active layer and the second optical guiding layer, the relationship of X≧Y2≧0 is satisfied; and the second optical guiding layer has such a thickness as to produce a quantum effect. Thus, the second optical guiding layer can become transparent to the wavelength of the laser light caused to oscillate by the active layer, thereby preventing the heat generation in close to the active layer.

In the second semiconductor device, it is preferable that an oxide film is formed at the surface layer of the region in contact with the cladding layer in the first optical guiding layer. Thus, the interface resistance between the first optical guiding layer and cladding layer can be made large with ease and reproducibly.

A third semiconductor laser device in accordance with the present invention comprises an active layer having a quantum well structure; a first optical guiding layer of one conductivity type made of $Ga_{1-y1}Al_{y1}As$ formed on the active layer; a second optical guiding layer of one conductivity type made of $Ga_{1-y2}Al_{y2}As$ formed in stripe on the first optical guiding layer; and a cladding layer of one conductivity type made of $Ga_{1-y3}Al_{y3}As$ formed on the first optical guiding layer and the second optical guiding layer, wherein the interface resistance between the first optical guiding layer and the cladding layer is larger than both the interface resistance between the first optical guiding layer and the second optical guiding layer, and the interface resistance between the second optical guiding layer and the cladding layer; and between Y2 and Y3 of each AlAs mole fraction of the second optical guiding layer and the cladding layer, the relationship of Y3>Y2 is satisfied.

According to the third semiconductor laser device, the active layer has a quantum well structure, resulting in lower threshold value and higher output power of the semiconductor laser.

Also, the interface resistance between the first optical guiding layer and the cladding layer is lager than both the interface resistance between the first optical guiding layer and the second optical guiding layer and the interface resistance between the second optical guiding layer and the cladding layer. Therefore, as in the case of the first semiconductor laser device, even without the formation of a current blocking layer, current can be confined within the stripe region. Accordingly, deep etching for forming a current blocking layer becomes no more necessary. This can decrease variation in stripe width, and the active layer has a quantum well structure, implementing a higher output power semiconductor laser device of index-guided structure operating at still lower current value with low cost and high yield.

Also, between Y2 and Y3 of each AlAs mole fraction of the second optical guiding layer and the cladding layer, the relationship of Y3>Y2 is satisfied. Consequently, the refractive index of the second optical guiding layer becomes larger than the refractive index of the cladding layer, resulting in stable single transverse mode by the real refractive index-guided mechanism.

In the third semiconductor laser device, it is preferable that the second optical guiding layer is transparent to the wavelength of laser light caused to oscillate by the active layer. Thus, in combination with the fact that the active layer has a quantum well structure, the heat generation in close to the active layer can be prevented, resulting in still higher output power and longer life of the semiconductor laser device.

Accordingly, in the third semiconductor laser device, it is preferable that the second optical guiding layer is so formed that its energy band gap has such a dimension as not to absorb the wavelength of laser light caused to oscillate by the active layer. Thus, the second optical guiding layer becomes transparent to the wavelength of the laser light caused to oscillate by the active layer, thereby preventing the heat generation in close to the active layer.

As another approach for forming transparent second optical guiding layer, in the third semiconductor laser device, it is preferable that the second optical guiding layer has such a thickness that the second optical guiding layer produces a quantum effect. Thus, the second optical guiding layer can become transparent to the wavelength of the laser light caused to oscillate by the active layer, thereby preventing the heat generation in close to the active layer.

In the third semiconductor laser device, it is preferable that an oxide film is formed at the surface layer of the region in contact with the cladding layer in the first optical guiding layer. Thus, the interface resistance between the first optical guiding layer and the cladding layer can be made large with ease and reproducibly.

A fourth semiconductor laser device in accordance with the present invention comprises an active layer made of $In_{x1}Ga_{1-x1}N$; a first optical guiding layer of one conductivity type made of AlGaN formed on the active layer; a second optical guiding layer of one conductivity type made of $In_{x2}Ga_{1-x2}N$ formed in stripe on the first optical guiding layer; and a cladding layer of one conductivity type made of AlGaN formed on the first optical guiding layer and the second optical guiding layer, wherein the interface resistance between the first optical guiding layer and the cladding layer is larger than both the interface resistance between the first optical guiding layer and the second optical guiding layer, and the interface resistance between the second optical guiding layer and the cladding layer.

According to the fourth semiconductor laser device, even without the formation of a current blocking layer, the second optical guiding layer with thin thickness can confine current within the stripe region. Therefore, deep etching for forming the current blocking layer becomes no more necessary, which decreases the variation in stripe width. Consequently, a semiconductor laser device of index-guided structure operating at low current value can be implemented with low cost and high yield.

Also, since InGaN is employed for the second optical guiding layer, while AlGaN is employed for the cladding layer, the refractive index of the second optical guiding layer becomes larger than that of the cladding layer. Consequently, the effective refractive index of the stripe region becomes higher than that of the region other than the stripe region, resulting in stable single transverse mode oscillation due to real refractive index step.

In the fourth semiconductor laser device, it is preferable that the second optical guiding layer is transparent to the wavelength of laser light caused to oscillate by the active layer. Thus, the heat generation in close to the active layer can be prevented, resulting in higher output power and longer life of the semiconductor laser device.

In the fourth semiconductor laser device, it is preferable that between X1 and X2 of each InN mole fraction of the active layer and the second optical guiding layer, the relationship of X1>X2 is satisfied. Thus, the second optical guiding layer becomes transparent to the wavelength of laser light caused to oscillate by the active layer, preventing the heat generation in close to the active layer.

As another approach for forming transparent second optical guiding layer, in the fourth semiconductor laser device, it is preferable that between X1 and X2 of each InN mole fraction of the active layer and the second optical guiding layer, the relationship of $X2 \geq X1 \geq 0$ is satisfied; and the second optical guiding layer has such a thickness as to produce a quantum effect. Thus, the second optical guiding layer can become transparent to the wavelength of the laser light caused to oscillate by the active layer, thereby preventing the heat generation in close to the active layer.

In the fourth semiconductor laser device, it is preferable that an oxide film is formed at the surface layer of the region in contact with the cladding layer in the first optical guiding layer. Thus, the interface resistance between the first optical guiding layer and the cladding layer can be made large with ease and reproducibly.

A fifth semiconductor laser device in accordance with the present invention comprises an active layer made of $In_{x1}Ga_{1-x1}N$; a first optical guiding layer of one conductivity type made of $Al_{z1}Ga_{1-z1}N$ formed on the active layer; a second optical guiding layer of one conductivity type made of $Al_{z2}Ga_{1-z2}N$ formed in stripe on the first optical guiding layer; and a cladding layer of one conductivity type made of $Al_{z3}Ga_{1-z3}N$ formed on the first optical guiding layer and the second optical guiding layer, wherein the interface resistance between the first optical guiding layer and the cladding layer is larger than both the interface resistance between the first optical guiding layer and the second optical guiding layer, and the interface resistance between the second optical guiding layer and the cladding layer; and between X1, Z1, Z2, and Z3 of each AlN mole fraction of the active layer, the first optical guiding layer, the second optical guiding layer, and the cladding layer, the relationships of $X1 \geq 0$, $Z1 > Z2$, and $Z3 > Z2$ are satisfied.

According to the fifth semiconductor laser device, it becomes easy for current to flow through only the region where the second optical guiding layer is formed, i.e., stripe region. Therefore, even without the formation of the current blocking layer, the second optical guiding layer with thin thickness can confine current within the stripe region. Accordingly, as in the case of the first semiconductor laser device, deep etching for forming a current blocking layer becomes no more necessary. This can decrease variation in stripe width, implementing a semiconductor laser device of index-guided structure with low cost and high yield.

Also, between Z2 and Z3 of each AlN mole fraction of the second optical guiding layer and the cladding layer, the relationship of $Z3 > Z2$ is satisfied. Consequently, the refractive index of the second optical guiding layer becomes larger than the refractive index of the cladding layer, so that the effective refractive index of the stripe region becomes larger than that of the region other than the stripe region. This results in stable single transverse mode oscillation at a low current value due to real reflective index step.

Also, the second optical guiding layer becomes transparent to the wavelength of the laser light caused to oscillate by the active layer, and hence there is no heat generation in close to the active layer. Therefore, higher output power and longer life of the semiconductor laser device can be implemented.

In the fifth semiconductor laser device, it is preferable that an oxide film is formed at the surface layer of the region in contact with the cladding layer in the first optical guiding layer. Thus, the interface resistance between the first optical guiding layer and the cladding layer can be made large with ease and reproducibly.

A sixth semiconductor laser device in accordance with the present invention comprises an active layer having a quantum well structure; a first optical guiding layer of one conductivity type made of AlGaN formed on the active layer; a second optical guiding layer of one conductivity type made of InGaN formed in stripe on the first optical guiding layer; and a cladding layer of one conductivity type made of AlGaN formed on the first optical guiding layer and the second optical guiding layer, wherein the interface resistance between the first optical guiding layer and the cladding layer is larger than both the interface resistance between the first optical guiding layer and the second optical guiding layer, and the interface resistance between the second optical guiding layer and the cladding layer.

According to the sixth semiconductor laser device, the active layer has a quantum well structure. This results in lower threshold value and higher output power of the semiconductor laser device of the InGaN system.

Also, the interface resistance of the first optical guiding layer and the cladding layer is lager than both the interface resistance between the first optical guiding layer and the second optical guiding layer and the interface resistance between the second optical guiding layer and the cladding layer. Therefore, even without the formation of a current blocking layer, current can be confined within the stripe region. Accordingly, deep etching for forming a current blocking layer becomes no more necessary. This decreases variation in stripe width. By the decreased variation and the function of the active layer having a quantum well structure, a high output power semiconductor laser device of real refractive index-guided structure operating at low current value can be implemented with low cost and high yield.

In the sixth semiconductor laser device, it is preferable that the second optical guiding layer is transparent to the wavelength of laser light caused to oscillate by the active layer. Thus, in combination with the fact that the active layer has a quantum well structure, the second optical guiding layer is transparent to the wavelength of laser light caused to oscillate by the active layer, preventing the heat generation in close to the active layer. This results in still higher output power and longer life of the semiconductor laser device.

In the sixth semiconductor laser device, it is preferable that the second optical guiding layer is so formed that its energy band gap has such a value as not to absorb the wavelength of laser light caused to oscillate by the active layer. Thus, the second optical guiding layer becomes transparent to the wavelength of the laser light caused to oscillate by the active layer, thereby controlling the heat generation in close to the active layer.

As another approach for forming transparent second optical guiding layer, in the sixth semiconductor laser device, it is preferable that the second optical guiding layer has such a thickness that the second optical guiding layer produces a quantum effect. Thus, the second optical guiding layer can become transparent to the wavelength of the laser light caused to oscillate by the active layer, thereby preventing the heat generation in close to the active layer.

In the sixth semiconductor laser device, it is preferable that an oxide film is formed at the surface layer of the region in contact with the cladding layer in the first optical guiding layer. Thus, the interface resistance between the first optical guiding layer and the cladding layer can be made large with ease and reproducibly.

A seventh semiconductor laser device in accordance with the present invention comprises an active layer having a quantum well structure; a first optical guiding layer of one conductivity type made of $Al_{z1}Ga_{1-z1}N$ formed on the active layer; a second optical guiding layer of one conductivity type made of $Al_{z2}Ga_{1-z2}N$ formed in stripe on the first optical guiding layer; and a cladding layer of one conductivity type made of $Al_{z3}Ga_{1-z3}N$ formed on the first optical guiding layer and the second optical guiding layer, wherein the interface resistance between the first optical guiding layer and the cladding layer is larger than both the interface resistance between the first optical guiding layer and the second optical guiding layer, and the interface resistance between the second optical guiding layer and the cladding layer; and between Z2 and Z3 of each AlN mole fraction of the second optical guiding layer and the cladding layer, the relationship of Z3>Z2 is satisfied.

According to the seventh semiconductor laser device, the active layer has a quantum well structure. This results in lower threshold value and higher output power of the semiconductor laser device of the InGaN system.

Also, the interface resistance between the first optical guiding layer and the cladding layer is lager than both the interface resistance between the first optical guiding layer and the second optical guiding layer and the interface resistance between the second optical guiding layer and the cladding layer. Therefore, even without the formation of a current blocking layer, current can be confined within the stripe region. Accordingly, deep etching for forming a current blocking layer becomes no more necessary. This decreases variation in stripe width, and the active layer has a quantum well structure, making it possible to implement a higher output power semiconductor laser device of index-guided structure operating at still lower current value with low cost and high yield.

Also, between Z2 and Z3 of each AlN mole fraction of the second optical guiding layer and the cladding layer, the relationship of Z3>Z2 is satisfied. Therefore, the refractive index of the second optical guiding layer becomes larger than that of the cladding layer, resulting in stable single transverse mode by the real index-guided mechanism.

Also, the second optical guiding layer is transparent to the wavelength of laser light caused to oscillate by the active layer, while the active layer has a quantum well structure. Therefore, the heat generation in close to the active layer can be prevented, resulting in still higher output power and longer life of the semiconductor laser device.

In the seventh semiconductor laser device, it is preferable that an oxide film is formed at the surface layer of the region in contact with the cladding layer in the first optical guiding layer. Thus, the interface resistance between the first optical guiding layer and cladding layer can be made large with ease and reproducibly.

A first method for producing a semiconductor laser device in accordance with the present invention comprises the steps of: forming an active layer on a semiconductor substrate; forming a first optical guiding layer of one conductivity type made of $Ga_{1-y1}Al_{y1}As$ on the active layer by means of an epitaxial growth technique; forming a second optical guiding layer of one conductivity type made of $Ga_{1-y2}Al_{y2}As$ on the first optical guiding layer; etching the second optical guiding layer so as to have a stripe structure; and forming a cladding layer of one conductivity type made of $Ga_{1-y3}Al_{y3}As$ on the first optical guiding layer and the second optical guiding layer by means of an epitaxial growth technique, so that between Y2 and Y3 of each AlAs mole fraction of the $Ga_{1-y2}Al_{y2}As$ and the $Ga_{1-y3}Al_{y3}As$, the relationship of Y3>Y2 is satisfied.

According to the first production method, after the second optical guiding layer is formed on the first optical guiding layer, the second optical guiding layer is etched in a stripe structure. Therefore, on the first optical guiding layer, is formed a second optical guiding layer in stripe.

Also, on the first optical guiding layer made of $Ga_{1-y1}Al_{y1}As$ and the second optical guiding layer made of $Ga_{1-y2}Al_{y2}As$, the cladding layer made of $Ga_{1-y3}Al_{y3}As$ is formed so that between Y2 and Y3 of each AlAs mole fraction of $Ga_{1-y2}Al_{y2}As$ and $Ga_{1-y3}Al_{y3}$, the relationship of Y3>Y2 is satisfied. Therefore, the refractive index of the second optical guiding layer can be made larger than that of the cladding layer, and hence the difference in effective refractive index between inside and outside the stripe region is formed. This results in formation of a real refractive index-guided structure. Consequently, a semiconductor laser device causing stable single transverse mode oscillation can be produced.

A second method for producing a semiconductor laser device in accordance with the present invention comprises the steps of: forming an active layer on a semiconductor substrate; forming a first optical guiding layer of one conductivity type made of $Ga_{1-y1}Al_{y1}As$ on the active layer by means of an epitaxial growth technique; forming a second optical guiding layer of one conductivity type made of $Ga_{1-y2}Al_{y2}As$ on the first optical guiding layer; etching the second optical guiding layer so as to have a stripe structure; oxidizing the surface layer of the region not in contact with the second optical guiding layer in the first optical guiding layer; and forming a cladding layer of one conductivity type made of $Ga_{1-y3}Al_{y3}As$ on the first optical guiding layer and the second optical guiding layer by means of an epitaxial growth technique, so that between Y2 and Y3 of each AlAs mole fraction of the $Ga_{1-y2}Al_{y2}As$ and the $Ga_{1-y3}Al_{y3}As$, the relationship of Y3>Y2 is satisfied.

According to the second production method, the method includes a step for oxidizing the surface layer of the region where the second optical guiding layer is not formed in the first optical guiding layer. Therefore, a semiconductor laser device having an oxide film at the surface layer of the region, in contact with the cladding layer, in the first optical guiding layer can be formed with reproducibly.

A third method for producing a semiconductor laser device in accordance with the present invention comprises the steps of: forming an active layer on a semiconductor substrate; forming a first optical guiding layer of one conductivity type made of AlGaN on the active layer by means of an epitaxial growth technique;, forming a second optical guiding layer of one conductivity type made of InGaN on the first optical guiding layer; etching the second optical guiding layer so as to have a stripe structure; and forming a cladding layer of one conductivity type made of AlGaN on the first optical guiding layer and the second optical guiding layer by means of an epitaxial growth technique.

According to the third production method, after the second optical guiding layer is formed on the first optical guiding layer, the second optical guiding layer is etched in a stripe structure. Therefore, on the first optical guiding layer, a second optical guiding layer in stripe is formed.

Also on the first optical guiding layer made of AlGaN and the second optical guiding layer made of InGaN, the cladding layer made of AlGaN is formed. Therefore, the refractive index of the second optical guiding layer can be made larger than that of the cladding layer, and hence the difference in effective refractive index between inside and outside the stripe region is formed. This results in formation of a real refractive index-guided structure. Consequently, a semiconductor laser device causing stable single transverse mode oscillation can be produced.

A fourth method for producing a semiconductor laser device in accordance with the present invention comprises the steps of: forming an active layer on a semiconductor substrate; forming a first optical guiding layer of one conductivity type made of AlGaN on the active layer by means of an epitaxial growth technique; forming a second optical guiding layer of one conductivity type made of InGaN on the first optical guiding layer; etching the second optical guiding layer so as to have a stripe structure; oxidizing the surface layer not in contact with the second optical guiding layer in the first optical guiding layer;and forming a cladding layer of one conductivity type made of AlGaN on the first optical guiding layer and the second optical guiding layer by means of an epitaxial growth technique.

According to the fourth production method, the method includes a step for oxidizing the surface layer of the region where the second optical guiding layer is not formed in the first optical guiding layer. Therefore, a semiconductor laser device having an oxide film at the surface layer of the region, in contact with the cladding layer, in the first optical guiding layer can be formed with reproducibly.

A fifth method for producing a semiconductor laser device in accordance with the present invention comprises the steps of: forming an active layer on a semiconductor substrate; forming a first optical guiding layer of one conductivity type made of $Al_{z1}Ga_{1-z1}N$ on the active layer by means of an epitaxial growth technique; forming a second optical guiding layer of one conductivity type made of $Al_{z2}Ga_{1-z2}N$ on the first optical guiding layer; etching the second optical guiding layer so as to have a stripe structure; and forming a cladding layer of one conductivity type made of $Al_{z3}Ga_{1-z3}N$ on the first optical guiding layer and the second optical guiding layer by means of an epitaxial growth technique, so that between Z2 and Z3 of each AlN mole fraction of the $Al_{z2}Ga_{1-z2}N$ and the $Al_{z3}Ga_{1-z3}N$, the relationship of Z3>Z2 is satisfied.

According to the fifth production method, after the second optical guiding layer is formed on the first optical guiding layer, the second optical guiding layer is etched in a stripe structure. Therefore, on the first optical guiding layer, a second optical guiding layer in stripe is formed.

Also on the first optical guiding layer made of $Al_{z1}Ga_{1-z1}N$ and the second optical guiding layer made of $Al_{z2}Ga_{1-z2}N$, the cladding layer made of $Al_{z3}Ga_{1-z3}N$ is formed so that between Z2 and Z3 of each AlN mole fraction of the second optical guiding layer and cladding layer, the relationship of Z3>Z2 is satisfied. Therefore, the refractive index of the second optical guiding layer can be made larger than that of the cladding layer, and hence the difference in effective refractive index between inside and outside the stripe region is formed. This results in formation of a real refractive index-guided structure. Consequently, a semiconductor laser device causing stable single transverse mode oscillation can be produced.

A sixth method for producing a semiconductor laser device in accordance with the present invention comprises the steps of: forming an active layer on a semiconductor substrate; forming a first optical guiding layer of one conductivity type made of $Al_{z1}Ga_{1-z1}N$ on the active layer by means of an epitaxial growth technique; forming a second optical guiding layer of one conductivity type made of $Al_{z2}Ga_{1-z2}N$ on the first optical guiding layer; etching the second optical guiding layer so as to have a stripe structure; oxidizing the surface layer of the region not in contact with the second optical guiding layer in the first optical guiding layer; and forming a cladding layer of one conductivity type made of $Al_{z3}Ga_{1-z3}N$ on the first optical guiding layer and the second optical guiding layer by means of an epitaxial growth technique, so that between Z2 and Z3 of each AlN mole fraction of the $Al_{z2}Ga_{1-z2}N$ and the $Al_{z3}Ga_{1-z3}N$, the relationship of Z3>Z2 is satisfied.

According to the sixth production method, the method includes a step for oxidizing the surface layer of the region where the second optical guiding layer is not formed in the first optical guiding layer. Therefore, a semiconductor laser device having an oxide film at the surface layer of the region, in contact with the cladding layer, in the first optical guiding layer can be formed with reproducibly.

DETAILED DESCRIPTION OF THE PREFERRED EMBODIMENTS

Below, a first embodiment of the present invention will now be described with reference to drawings.

Figure 1:
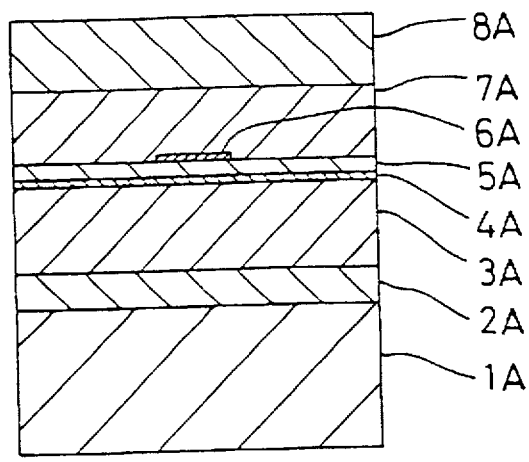
FIG. 1 is a cross sectional view of a semiconductor laser device in accordance with a first embodiment of the present invention.

FIG. 1 is a cross sectional view of a semiconductor laser device in accordance with a first embodiment of the present invention. On an n-type semiconductor substrate 1A made of GaAs, is formed an n-type buffer layer 2A made of GaAs (0.5 μm in thickness). On the buffer layer 2A, is formed an n-type cladding layer 3A made of $Ga_{0.5}Al_{0.5}As$ (1.5 μm in thickness). On the cladding layer 3A, is formed an active layer 4A made of $Ga_{0.85}Al_{0.15}As$ (0.04 μm in thickness). On the active layer 4A, is formed a p-type first optical guiding layer 5A (0.1 μm in thickness) made of $Ga_{0.5}Al_{0.5}As$ as a first semiconductor layer. On the first optical guiding layer DA, is formed a p-type second optical guiding layer 6A (20 nm in thickness) made of $Ga_{0.8}Al_{0.2}As$ in stripe as a second semiconductor layer. On the first and second optical guiding layers 5A and 6A, by means of a growth technique a p-type buried first cladding layer 7A (1.5 μm in thickness) made of $Ga_{0.5}Al_{0.5}As$ as a third semiconductor layer is formed. On the buried cladding layer 7A, a contact layer 8A made of GaAs (2 μm in thickness) is formed.

In this construction, in order to obtain stable single transverse mode oscillation, the second optical guiding layer 6A is formed with a higher refractive index than that of the buried cladding layer 7A. In the first embodiment, this is implemented by making the AlAs mole fraction of the second optical guiding layer 6A lower than the AlAs mole fraction of the buried cladding layer 7A.

If the AlAs mole fraction of the second optical guiding layer GA is the same as that of the buried cladding layer 7A, the refractive index of the stripe region decreases to form anti-guide waveguide because of plasma effect, resulting in no single transverse mode oscillation. Further, when the AlAs mole fraction of the second optical guiding layer 6A is higher than that of the buried cladding layer 7A, the transverse mode oscillation becomes extremely unstable. In this first embodiment, the AlAs mole fraction of the second optical guiding layer 6A is taken as 0.2, i.e., a value sufficiently lower than the AlAs mole fraction of the buried cladding layer 7A.

Figure 2:
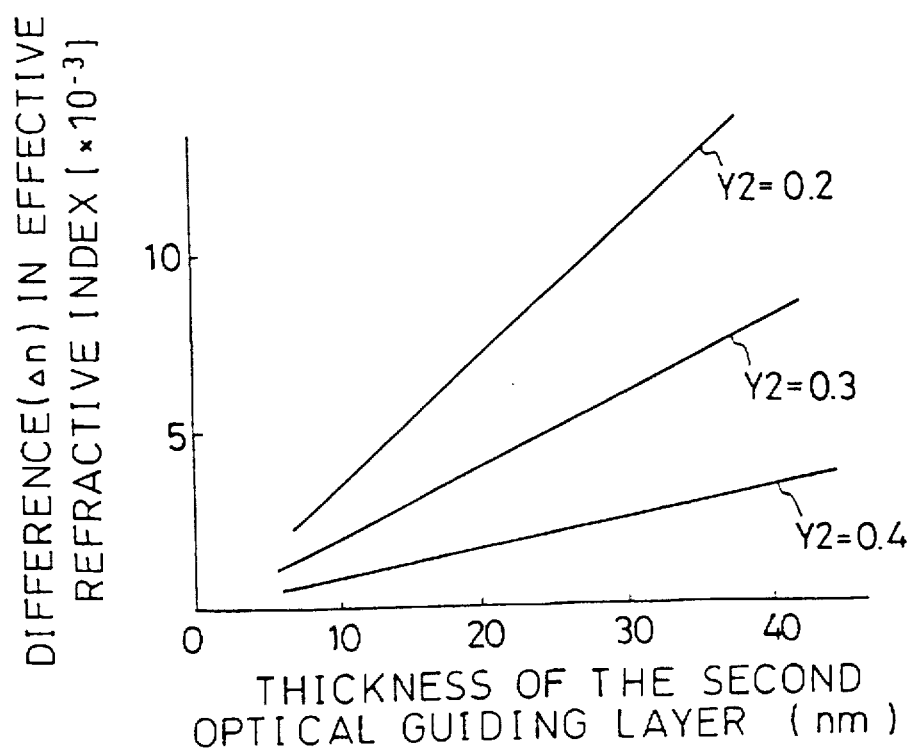
FIG. 2 is a diagram showing one example of the results of numerical calculations of the difference($\Delta$n) in effective refractive index between inside and outside the stripe region in the semiconductor laser device in accordance with the first embodiment.

FIG. 2 shows one example of the results of numerical calculation of the difference (Δn) in effective refractive index between inside and outside the stripe. This diagram indicates as follows: when the AlAs mole fraction of the buried cladding layer 7A to be employed for light with a wavelength in 780 nm region for use in an optical disk is 0.5, the AlAs mole fraction of the second optical guiding layer 6A (Y2) is taken as 0.2, and the thickness thereof is taken as about 20 nm. This results in an effective refractive index difference $\Delta n=7\times 10^{-3}$ which is sufficient for obtaining an index-guided structure. Thus, in the first embodiment, the adequate setting of the AlAs mole fraction of the second optical guiding layer 6A enables the design of the very thin second optical guiding layer 6A. This decreases remarkably differences between heights in the stripe region and outside the stripe region, causing no problem of decreasing the yield resulting from side etching or the like. Actually, a variation in stripe width is decreased to the very small order of the mask width due to a photolithography process. Also, etching is shallow, and hence a semiconductor laser device with a flat surface can be implemented with ease.

When a non-selective solution such as solution containing tartaric acid or sulfric acid as main component is used as etchant, over-etching along its depth occurs slightly. However, if the AlAs mole fraction of the first optical guiding layer 5A is made equal to that of the buried cladding layer 7A, the difference Δn in effective refractive index will not vary so long as etching is stopped within the first optical guiding layer 5A. Consequently, a semiconductor laser device exhibiting the same characteristics with high reproducibility from batch to batch, or within a wafer can be provided. In the first embodiment, since the thickness of the first optical guiding layer 5A is set to 0.1 μm, which is five times the thickness of the second optical guiding layer 6A, even when non-selective etchant is used, etching can be stopped within the first optical guiding layer 5A with reproducibly.

Next, the principle of current confinement will now be described. The confinement of current within the stripe region can be readily implemented by making the interface resistance between the first optical guiding layer 5A and buried cladding layer 7A sufficiently higher than the interface resistance between the first optical guiding layer 5A and second optical guiding layer 6A and the interface resistance between the second optical guiding layer 6A and buried cladding layer 7A. In the first embodiment, this is implemented by making the AlAs mole fraction of the first optical guiding layer 5A sufficiently higher than that of the second guide layer 6A. That is, with materials of the GaAlAs system, the AlAs mole fraction increases number of the defect arising from oxidation of Al when its surface is exposed to air. Therefore, a semiconductor substrate with high AlAs mole fraction is used to a growth step, which degrades the cristallinity of grown interface. This essentially raises the resistance at the interface.

Figure 3:
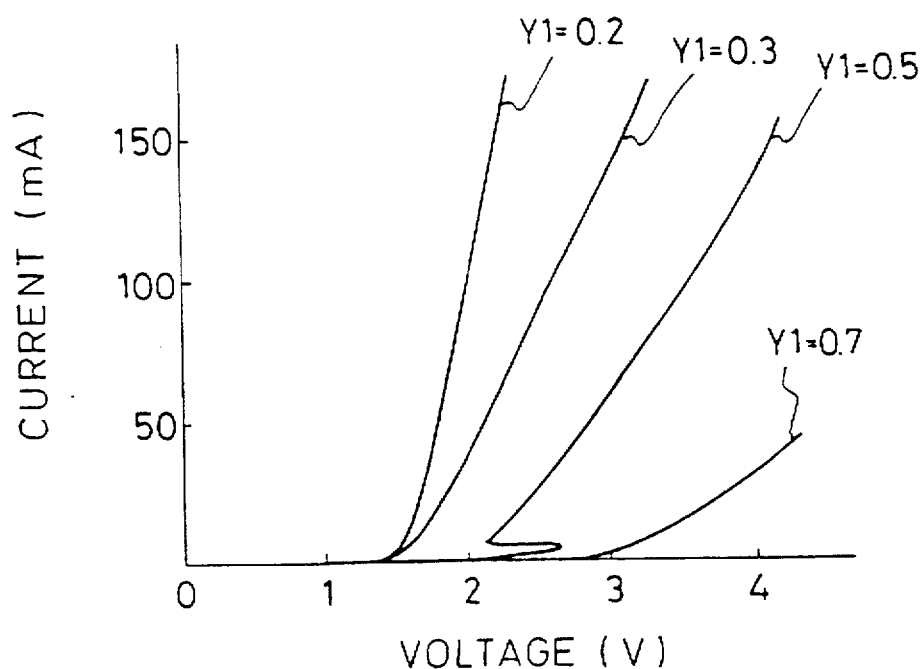
FIG. 3 is a diagram showing the experimental results on the relationship of the current-voltage characteristics with respect to the AlAs mole fraction of a semiconductor substrate in the semiconductor laser device in accordance with the first embodiment.

FIG. 3 shows the experimental results of current-voltage characteristics with respect to the AlAs mole fraction of the semiconductor substrate surface obtained by experiment. The semiconductor substrate used in the experiment is obtained by removing the second optical guiding layer 6A, and changing the AlAs mole fraction (Y1) of the first optical guiding layer 5A in the semiconductor laser device shown in FIG. 1. That is, it is obtained by performing a growth step on the first optical guiding layer 5A by means of a MOCVD technique. It is indicated that voltage increases with an increase in AlAs mole fraction. Especially, with an AlAs mole fraction of 0.5 or more, the formation of potential barrier is observed with an increase in resistance of the interface, and hence a dip is observed on the rising edge of voltage. Since the driving voltage of the semiconductor laser herein used is about 2 V, at most, current will not flow through the region in which a dip equal to or greater than this is formed. Consequently, in the first embodiment, by use of the foregoing phenomenon, the AlAs mole fraction of the first optical guiding layer 5A is set to 0.5, while the AlAs mole fraction of the second optical guiding layer 6A is set to 0.2, thereby achieving the confinement of current within the stripe region. In this situation, in order to well inject current into the stripe region without a problem of interface, it is desirable that the AlAs mole fraction of the second optical guiding layer 6A is 0.3 or less.

Further, this phenomenon is not limited to the GaAlAs system, but also observed in other materials containing Al as a main component such as the InGaAlP system whereby the same current confinement is implementable.

Also, in the first embodiment, a description was given to only the case of the oxidation phenomenon of Al. However, even with other semiconductor materials (materials containing no Al such as InP system, InGaAsP system, and ZnSe system), the first optical guiding layer 5A at the surface of the semiconductor substrate 1 can be forcefully oxidized to implement the same current confinement. That is, after the second optical guiding layer 6A is masked in stripe to be etched, and prior to removing the mask, the first optical guiding layer 5A can be exposed into oxygen atmosphere to be oxidized, resulting in the formation of the oxide layer at the surface layer of the region, in contact with the buried cladding layer 7A, in the first optical guiding layer 5A. Unlike a liquid phase epitaxial growth technique whereby crystal growth is carried out at thermal equilibrium state, by use of a MOCVD or MBE growth technique whereby crystal growth is carried out at non-thermal equilibrium state, crystal is grown almost forcefully. Therefore, crystal growth is also possible even on the semiconductor substrate 1 with a minute amount of oxide film being formed thereon. Of course, also in the materials containing Al as main component, the interface resistance between the first optical guiding layer 5A and buried cladding layer 7A outside the stripe region may be set high to employ a MOCVD or MBE growth technique in order to achieve more excellent current confinement. This method can stabilize the device while being in a process.

Also, in this construction, the current injected from a p-type GaAs contact layer 8A is confined within the stripe region to cause laser oscillation of a 780 nm region in the active layer 4A made of $Ga_{0.85}Al_{0.15}As$ underneath the stripe region. Further, this construction is of a real refractive index-guided structure, and also will cause no scattering loss due to the etched profile of the active layer as in a BH structure. This results in a low internal loss semiconductor laser device operating at low current value.

Further, in this construction, the formation of small difference $\Delta n$ in effective refractive index can also be implemented by changing the thickness of each layer. Accordingly, laser light can be spread outside the stripe region to attain multimode of spectrum. This can provide a low noise semiconductor laser device with ease.

Figure 4:
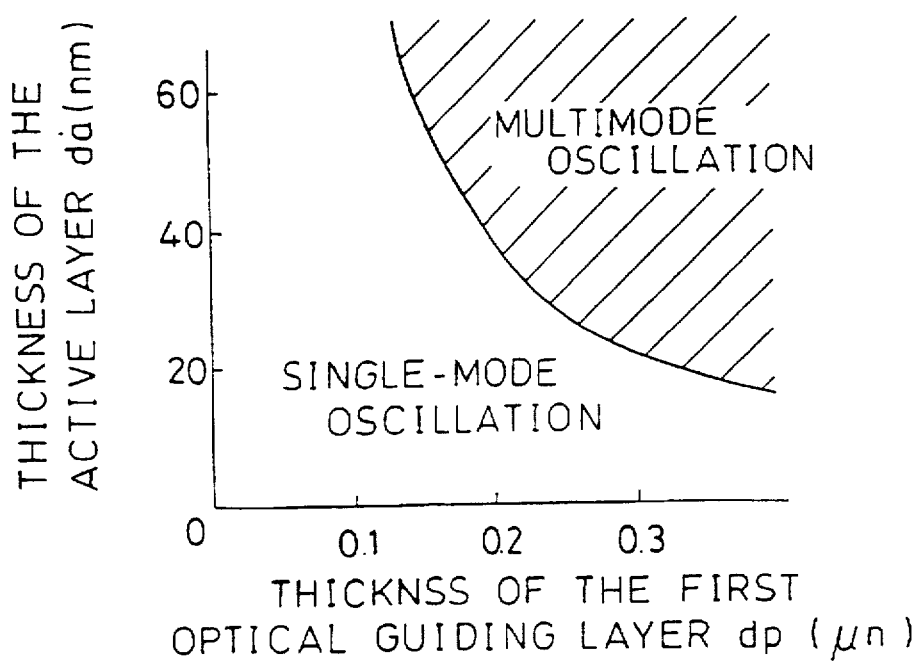
FIG. 4 is a diagram showing the experimental results on the relationship between the spectral characteristics and structural parameter in the semiconductor laser device in accordance with the first embodiment.

FIG. 4 shows the experimental results on the relationship between the spectral characteristics and structural parameters in the first embodiment of the present invention. It is indicated that in a wavelength of 780 nm region, multimode oscillation can be obtained in an area where the thickness (da) of the active layer 4A and the thickness (dp) of the first optical guiding layer 5A are large. In this case, the thickness of the second optical guiding layer 6A required for decreasing the difference $\Delta n$ in effective refractive index to make multimode is 10 nm. By producing a semiconductor laser device in such a range, a low noise semiconductor laser device for use in a CD and the like can be implemented with ease.

However, when to each GaAlAs layer capable of guiding light, i.e., to the n-type $Ga_{0.5}Al_{0.5}As$ cladding layer 3A in the first embodiment, as commonly used impurity, Te is doped in a liquid phase epitaxial growth technique, and Se is doped in a metal organic chemical vapor deposition (MOCVD) technique, these impurities become DX center. This causes a saturable absorbing effect at the light density of the dominant mode in oscillation at several mW to several tens mW. Consequently, a grating with distribution of loss is formed with respect to the standing wave of the dominant mode in oscillation to suppress modes other than the dominant mode in oscillation, resulting in an enhancement in single mode property which increases the noise.

In order to solve this problem, in the first embodiment, Si is doped as an impurity into each GaAlAs layer capable of guiding light. With Si, the activation energy due to the thermal trapping and release of carriers between the DX center level and conduction band in GaAlAs is different from that in the case of Te and Se. Therefore, light absorption is saturated at very low light density, resulting in almost no formation of a grating with distribution of loss with respect to the dominant mode in oscillation. This entails no problem of impairing the multimode property of spectrum, making it easy to achieve low noise. For the same reason, the use of Si is effective in attaining multimode of spectrum by superimposing of high frequency to achieve low noise. That is, in order to achieve low noise in a semiconductor laser device so constructed that the difference $\Delta n$ in effective refractive index in a direction parallel to the junction plane is set large to make the spectrum of oscillation mode that of single mode, in the prior art, a method has been employed in which high frequency is superimposed on operating current to attain multimode of spectrum. However, as compared with the case of Te and Se where a grating with distribution of loss is formed, with Si, the spectrum can be made that of multimode with ease, resulting in low noise characteristic.

Below, a description will now be given to a production method of the semiconductor laser device in accordance with the first embodiment with reference to FIGS. 5(a), 5(b), and 5(c).

Figure 5A:
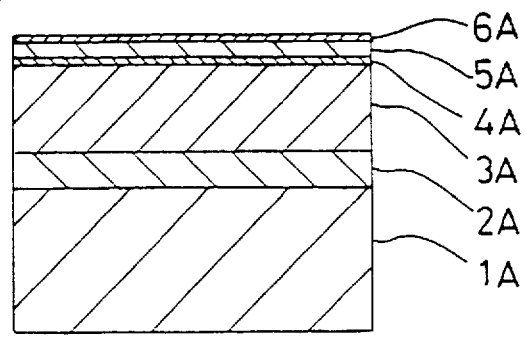
FIGS. 5(a) to 5(c) are cross sectional views showing each step in the method for producing the semiconductor laser device in accordance with the first embodiment.

First, referring to FIG. 5(a), on an n-type semiconductor substrate 1A made of GaAs, by means of a MOCVD or MBE growth technique, an n-type buffer layer 2A made of GaAs (0.5 μm in thickness), an n-type cladding layer 3A made of $Ga_{0.5}Al_{0.5}As$ (1.5 μm in thickness), an active layer 4A made of $Ga_{0.8}Al_{0.5}As$ (0.04 μm in thickness), a p-type first optical guiding layer 5A made of $Ga_{0.5}Al_{0.5}As$ (0.1 μm in thickness), and a p-type second optical guiding layer 6A made of $Ga_{0.8}Al_{0.2}As$ (20 nm in thickness) are successively grown. The AlAs mole fraction of the second optical guiding layer 6A is taken as 0.3 or less, which facilitates the growth step, and it is desirable to be the AlAs mole fraction which makes the layer transparent to laser light. Because even if the layer is very thin, the occurrence of laser light absorption may lead to heat generation in close to the active layer 4A, inhibiting the implementation of high-power and long life semiconductor laser device. In terms of this, in the first embodiment, not only from the requirements for designing the difference $\Delta n$ in effective refractive index, a value of 0.2 is to be employed as the AlAs mole fraction of the second optical guiding layer 6A, which is sufficiently larger than 0.15, i.e., the AlAs mole fraction of the active layer 4A.

In this case, the thicknesses of the active layer 4A and the thickness of the first optical guiding layer 5A are taken as the value resulting in a difference in effective refractive index $\Delta n=5 \times 10^{-3}$ in order to obtain stable single transverse mode. As for the conductivity type of the active layer 4A, there is no specified description, but it may be p-type, n-type, or of course, undoped.

Figure 5B:
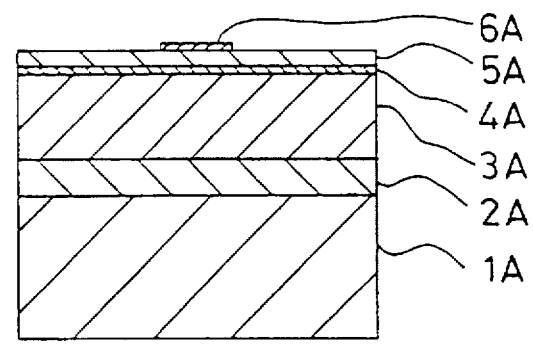

Next, as shown in FIG. 5(b), striped mesa is formed by etching with the use of a photolithography technique. The depth of etching is, since the thickness of the first optical guiding layer 5A is 20 nm, of such an order at most even if side etching proceeds, resulting in almost no occurrence of a variation in etching of the stripe region. When the stripe width is designed to be 2.0 μm, the semiconductor laser device actually produced has a variation in stripe width of ±0.1 μm or less. This is a value extremely decreased as compared with the variation in the range of ±0.3 to ±0.5 μm of the conventional semiconductor laser devices shown in FIGS. 9 to 12.

Figure 5C:
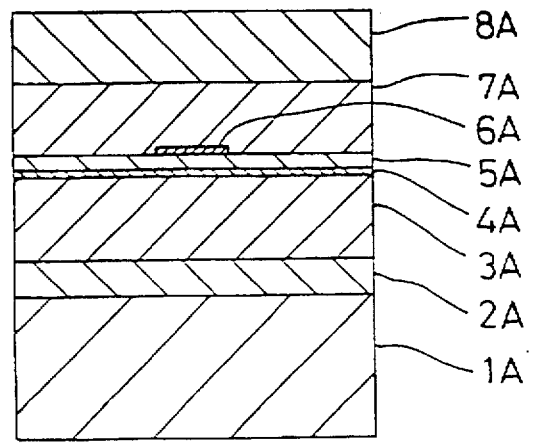

Next, as shown in FIG. 5(c), by means of a MOCVD or MBE growth technique, a p-type buried cladding layer 7A made of $Ga_{0.5}Al_{0.5}As$ and a p-type contact layer 8A made of GaAs are successively grown by a growth technique. In this step, in the stripe region where current is injected, the growth is carried out on the p-type second optical guiding layer 6A made of $Ga_{0.8}Al_{0.2}As$ with a low AlAs mole fraction, and hence the growth can be carried out with ease. However, when Zn is used as dopant for a p-type $Ga_{0.5}Al_{0.5}As$ cladding layer 7A, diffusion of Zn in the growth increases the internal loss. This may adversely affect the temperature characteristic in the current-optical output power characteristics. Especially, in the case of the active layer of quantum well structure, there is a problem of causing disorder in quantum well due to diffusion. In order to prevent this problem, at least, the carrier concentration of the ptype layer at the grown interface is required to be taken as $10^{18}$ cm$^{-3}$ or less. In this first embodiment, it is taken as $7 \times 10^{17}$ cm$^{-3}$.

In order to prevent the diffusion basically, carbon, i.e., dopant which will undergo less diffusion is preferably used as dopant for the p-type $Ga_{0.5}Al_{0.5}As$ cladding layer 7A. The use of carbon as dopant can provide characteristics excellent in temperature dependence in current-optical output power characteristics.

Next, electrodes are formed at the n-type semiconductor substrate 1A made of GaAs and p-type contact layer 8A made of GaAs, respectively.

In the above-described first embodiment, in order to make the second optical guiding layer 6A transparent to laser light, the AlAs mole fraction of the second optical guiding layer 6A is made larger than that of the active layer 4A. However, in place of this, the following may be adopted. That is, while the AlAs mole fraction of the second optical guiding layer 6A is made equal to or lower than that of the active layer 4A, the thickness of the second optical guiding layer 6A is made so thin as to produce a quantum effect, thus enabling the second optical guiding layer 6A to become transparent to laser light.

Figure 6:
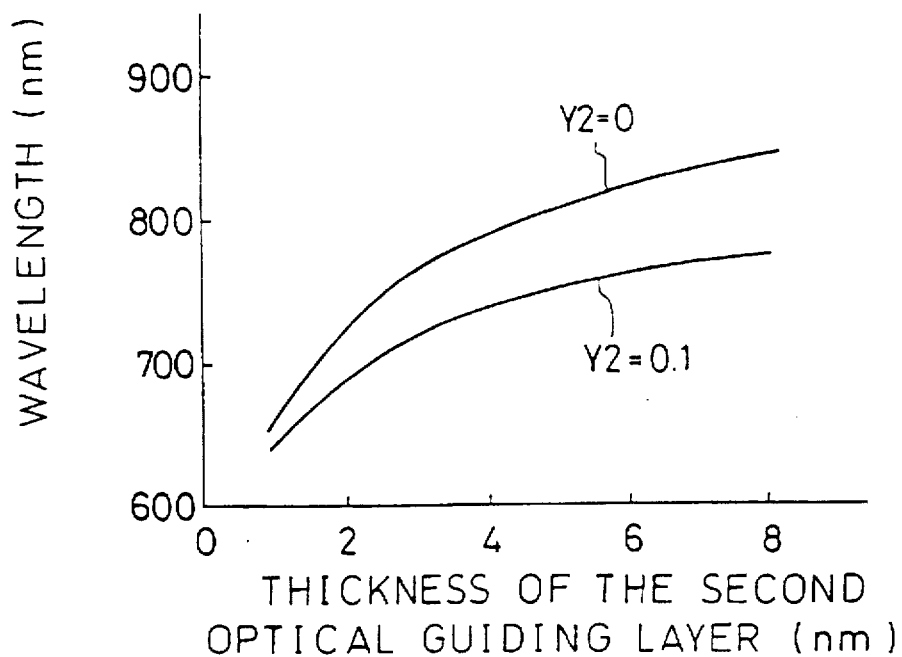
FIG. 6 is a diagram showing the results of calculation of energy when a second optical guiding layer of the semiconductor laser device in accordance with the first embodiment has a quantum well effect.

FIG. 6 shows the results of calculation when the second optical guiding layer 6A produces a quantum effect. The vertical axis shows the value obtained by converting the band energy produced due to the quantum effect of the second optical guiding layer 6A into wavelength. As revealed from this diagram, when the semiconductor laser device has a wavelength of laser oscillation of 780 nm as in the above-described first embodiment, even if the second optical guiding layer 6A is made of GaAs (Y2=0), with a layer thickness of 3 nm or less, the second optical guiding layer 6A becomes transparent due to a quantum effect. In this case, as compared with the first embodiment of FIG. 1., the AlAs mole fraction of the second optical guiding layer 6A can be taken as a low value. This can result in more excellent crystallinity of the grown interface within the stripe region, stabilizing the growth process. Also, the second optical guiding layer 6A has a very thin thickness in this case where a quantum effect is provided, while it has a substantially low AlAs mole fraction (with high refractive index). Therefore, the difference Δn in effective refractive index required for index-guided can be insured.

Also, in the above-described first embodiment, a description was given to only the case where GaAlAs with low AlAs mole fraction is employed for the second optical guiding layer 6A. But, the other materials capable of having a lattice match with GaAs may be employed. However, it is desirable that the second optical guiding layer 6A has a larger energy band gap than the wavelength of laser light in order to suppress light absorption. For example, a second optical guiding layer 6A made of $In_{0.5}Ga_{0.5}P$ may be employed. In this case, the same characteristics can also be provided.

Also, even by the use of a second optical guiding layer 6A made of $In_{1-x}Ga_xAs_yP_{1-y}$, the same characteristics as described above can be obtained. In this case, in order to have a lattice match with GaAs, X and Y are required to satisfy the relationship: $0.189Y-0.418X+0.013XY+0.127=0$.

Also, since the energy band gap of the second optical guiding layer 6A is required to be larger than the energy (E) of wavelength of laser light, it is desirable to satisfy the relationship: $1.35+0.672X-1.601Y+0.758X^2+0.101Y^2-0.157XY-0.312X^2Y+0.109XY^2>E$.

Also, a second optical guiding layer 6A made of $In_{0.5}(Ga_{1-x}Al_x)_{0.5}P$ may be used. In this case, regardless of X, the energy band gap becomes larger than the wavelength of laser light, and also a lattice match can be provided. However, when X is a too large value, a problem of oxidation occurs, and hence it is desirable that the relationship: X<0.3 is satisfied.

Further, in order to provide a lower threshold value and higher output power of the semiconductor laser device, the use of quantum well structure is effective. That is, in the active layer 4A, it is preferable to use a quantum well structure such as Single Quantum Well (SQW) structure, Double Quantum Well (DQW) structure, Triple Quantum Well (TQW) structure, Graded-Index (GRIN) structure, or Separate Confinement Heterostructure (SCH) thereof.

Figure 7:
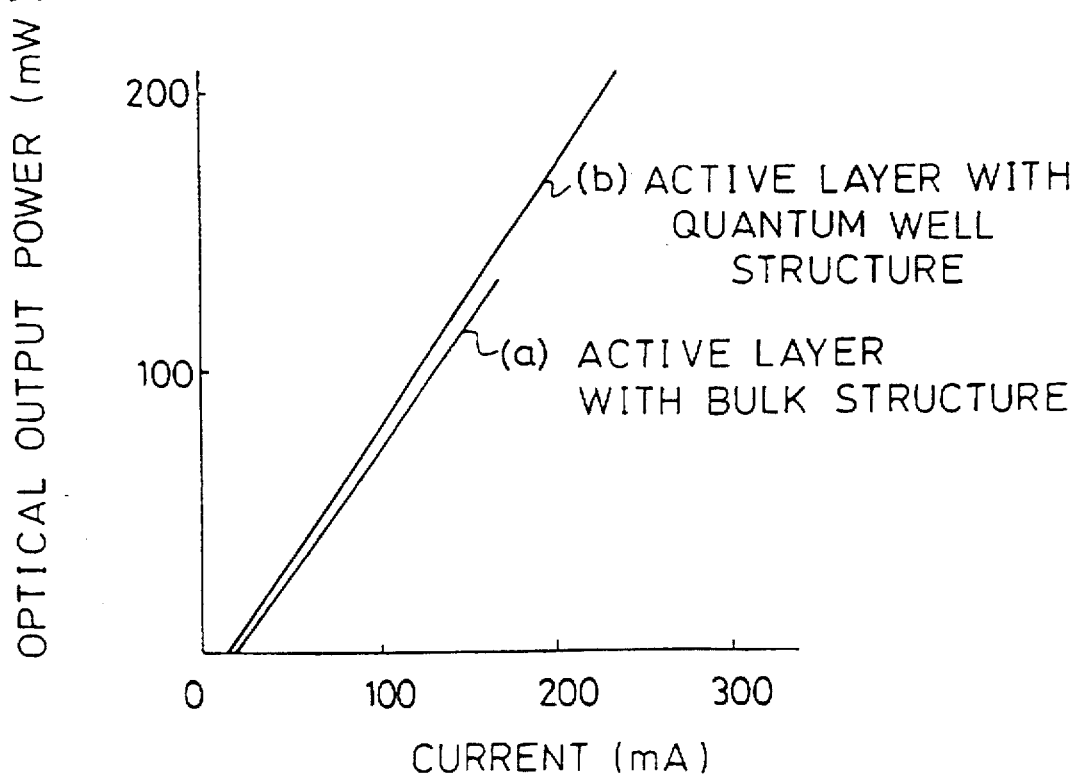
FIG. 7 is a diagram showing the current-optical output power characteristics in the semiconductor laser device in accordance with the first embodiment.

FIG. 7(a) is a characteristic diagram of the current-optical output power in the semiconductor laser device in accordance with the first embodiment shown in FIG. 1. The semiconductor laser device with a cavity length of 400 μm was coated on 10% of its front facet, and 75% of its rear facet. As a result of this, low demand characteristics of 20 mA in threshold value, and 0.9 mW/mA in slope efficiency could be obtained. The transverse mode and longitudinal mode were a stable single mode at a wavelength of 780 nm.

Below, a description will now be given to the low noise property of the semiconductor laser device in accordance with the first embodiment. The cavity length is taken as 200 μm, and the facet reflectivity is taken as 32%. In order to achieve lower noise, from FIG. 4, it is taken as follows: da=0.04 μm, and dp=0.22 μm. The operating current value required for emitting laser light of 3 mW at room temperature is 25 mA. As for transverse mode, oscillation is caused at stable fundamental mode. Oscillation is caused with a multimode generating self-pulsation with a spectrum of a 780 nm region, and a relative intensity noise (RIN) less than −130 dB/Hz is obtained within the range of 0 to 10% return light rate, resulting in low noise characteristics.

Below, a description will now be given to the case where a quantum well structure is employed for the active layer 4A in order to attain high performance of a semiconductor laser device. That is, by constructing the active layer 4A so as to have a quantum well structure, the threshold current value can be further decreased, resulting in high output power. FIG. 7(b) shows the current-optical output power characteristics when as quantum well structure, a Multi-Quantum Well (MQW) structure is used which is composed of four-layer well layer made of $Ga_{0.95}Al_{0.05}As$ with a thickness of 10 nm, and five-layer barrier layer made of $Ga_{0.7}Al_{0.3}As$ with a thickness of 4 nm which causes oscillation of laser light in a 780 nm region. In a semiconductor laser device with a cavity length of 400 μm, and front facet reflectivity of 10% and rear facet reflectivity of 75%, an optical output power of 200 mW or more can be implemented.

In the above-described first embodiment, a description was given only to the case where the n-type substrate is employed as the semiconductor substrate 1A, but a p-type semiconductor substrate may be used as the semiconductor substrate 1A. In conventional constructions, a current blocking layer with thickness of larger than the diffusion length of carriers has been needed. This makes it difficult to form a p-type current blocking layer for electrons with long diffusion length. Consequently, in a MOCVD or MBE: technique whereby a current blocking layer is formed on an active layer, only the n-type semiconductor substrate could have been put into practical use. This has been an important problem in terms of cost of the heat sink of a semiconductor laser in common use of a package as minus terminal. That is, in order to enhance the heat release property, a semiconductor laser is generally mounted to a heat sink with a p-n junction side down configuration. However, in the case of an n-type semiconductor substrate, the side to be mounted becomes p-type, and hence unless the polarity is reversed in the heat sink, the package becomes plus. Therefore, with a conventional heat sink, in the electrode pattern on a Si heat sink with an insulation layer thereon or SiC, the porality has been required to be reversed. This leads to high cost as mentioned above. However, according to this invention, since a p-type semiconductor substrate can be employed as semiconductor substrate 1A, the above-described problem associated with package can be solved, while a low cost semiconductor laser device can be implemented.

Below, a description will now be given to a semiconductor laser device in accordance with a second embodiment of the present invention with reference to FIG. 8. The semiconductor laser device in accordance with the second embodiment is the one having an active layer 4B made of InGaN and causing oscillation of blue laser light.

Figure 8:
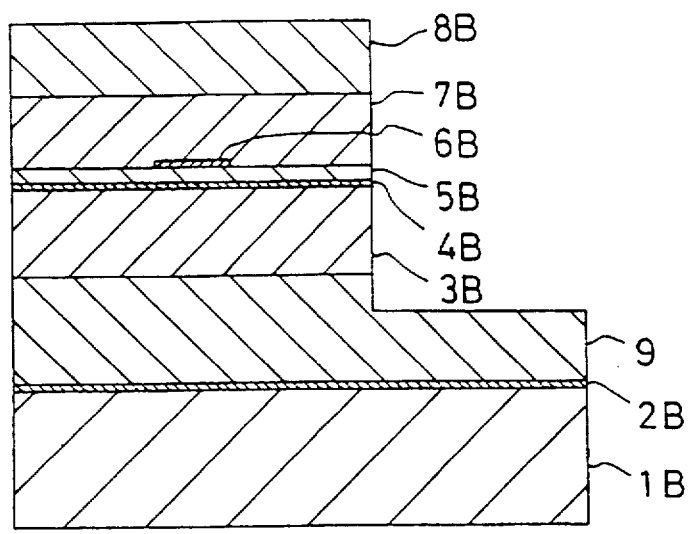
FIG. 8 is a cross sectional view of a semiconductor laser device in accordance with a second embodiment of the present invention.
Figure 9:
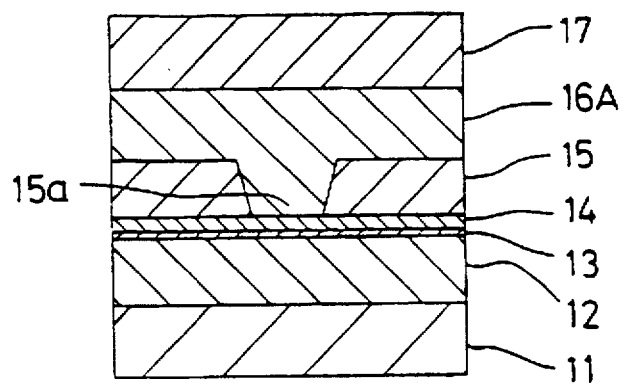
FIG. 9 is a cross sectional view of a conventional semiconductor laser device.
Figure 10:
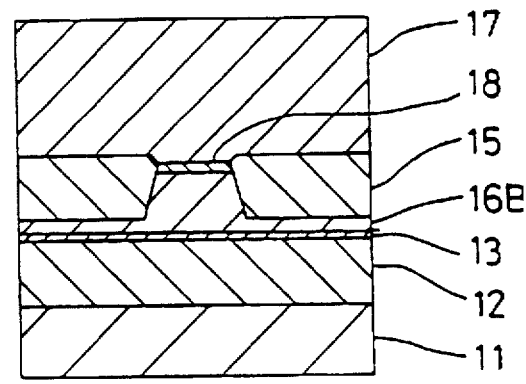
FIG. 10 is a cross sectional view of a conventional semiconductor laser device.
Figure 11:
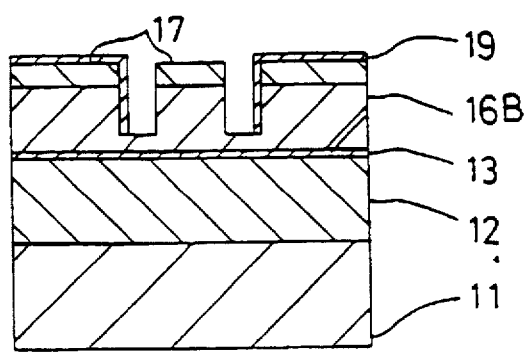
FIG. 11 is a cross sectional view of a conventional semiconductor laser device.
Figure 12:
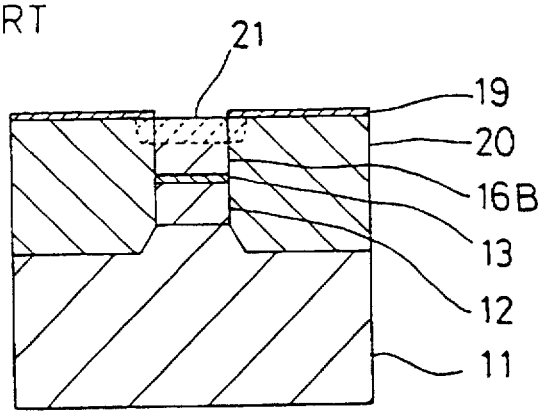
FIG. 12 is a cross sectional view of a conventional semiconductor laser device.
Figure 13:
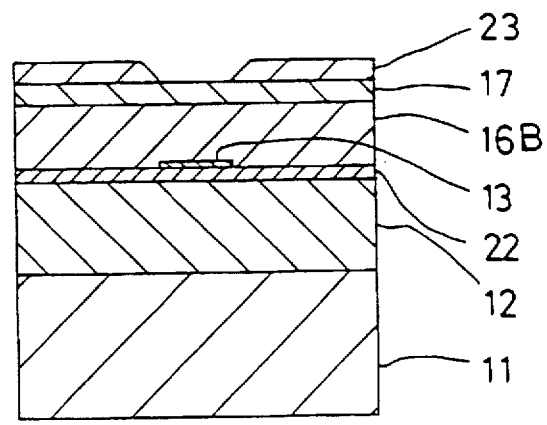
FIG. 13 is a cross sectional view of a conventional semiconductor laser device.

FIG. 8 illustrates the construction of the cross section of the semiconductor laser device in accordance with the second embodiment. Reffering more specifically to FIG. 8, on an insulating substrate 1B made of sapphire, a GaN buffer layer 2B, an n-type GaN second contact layer 9, an n-type AlGaN cladding layer 3B, an InGaN active layer 4B, a p-type AlGaN first optical guiding layer 5B, a p-type InGaN second optical guiding layer 6B, a p-type AlGaN buried cladding layer 7B, and a p-type GaN first contact layer 8B are formed. Electrodes are formed on the first contact layer 8B and the second contact layer 9 exposed by etching, respectively.

Below, a description will now be given to the method for producing the semiconductor laser device in accordance with the above-described second embodiment.

First, on the substrate 1B made of sapphire, the GaN buffer layer 2B is formed at a low temperature of about 500° C. by means of a MOCVD growth technique. Then, at a high temperature of 1000° C. or more, the second contact layer 9, cladding layer 3B, active layer 4B, first optical guiding layer 5B and second optical guiding layer 6B are successively grown. Next, the second optical guiding layer 6B is wet-etched in stripe. Thereafter, on the first optical guiding layer 5B and second optical guiding layer 6B, the buried cladding layer 7B and first contact layer 8B are successively grown at high temperature again by means of a MOCVD growth technique. Next, for exposing the region where the electode is to be formed in the second contact layer 9, etching is performed to form n-type and p-type electrodes on the exposed second contact layer 9 and the first contact layer 8B, respectively.

In the second embodiment, as material for constituting the substrate 1B, sapphire is used. But, in place of this, the other materials such as MgO, SiC, GaAs, and Si may be used. Of course, at some future time, if a substrate made of GaN can be implemented, it is preferable to use a substrate made of GaN.

Also, the thickness of each of the cladding layer 3B, active layer 4B, first optical guiding layer 5B, and second optical guiding layer 6B was almost the same as that in the first embodiment of the above-described GaAlAs system.

Also, in crystal growth, there exists a small difference in lattice constant between layers, and hence a layer for relieving crystal strain may be provided between layers. Specifically, it is preferable to provide thin layers each composition of which will gradually change between each layer, respectively.

In the second embodiment shown in FIG. 8, the first optical guiding layer 5B is a material containing Al. This introduces a defect to its surface which arises from oxidation due to exposure of its surface into air. On the first optical guiding layer 5B subjected to oxidation, the buried cladding layer 7B is formed by means of a growth technique, whereby the interface resistance between the first optical guiding layer 5B and cladding layer 73 becomes larger than that between the buried cladding layer 7B formed on the second optical guiding layer 6B containing no Al and the cladding layer 7B. That is, the current injected from the first contact layer 8B will flow only through the second optical guiding layer 63 formed in stripe into the active layer 4B. Therefore, even in no presence of a current blocking layer, current confinement can be implemented. In this method, it is desirable that the process includes a step for oxidizing the surface of the first optical guiding layer 5B in the region where the second optical guiding layer 6B does not exist.

Also, since the refractive index of the second optical guiding layer 6B made of InGaN is sufficiently larger than that of the buried cladding layer 7B made of AlGaN, a real refractive index-guided structure can be obtained, thereby implementing a single mode semiconductor laser device.

The crystal of the GaN system formed by means of a crystal growth technique is a hexagonal crystal unlike the crystal of the GaAs system, which entails the following problem in etching. That is, unlike the case of the GaAs system which is cubic crystal, the etched surface when subjected to wet etching in stripe will not be formed in the shape of easy-to-grow upwardly tapered mesa without irregularities, but has irregularities. On such a surface having irregularities, excellent crystal cannot be grown, and the presence of irregularities in the stripe region serving as a part of waveguide causes large loss in waveguide. For these reasons and the like, in a conventional semiconductor laser device so constructed that a current blocking layer is provided and etching as deep as about 1 μm is required, a layer of the GaN system could not have been employed for a layer required to be etched. However, in accordance with the second embodiment, the thickness of the second optical guiding layer 6B is about 20 nm, and hence extremely shallow etching can form the stripe region. The irregularities formed at the profile of the stripe region will hardly affect the process and characteristics of the semiconductor laser device.

It is preferable that the second optical guiding layer 6B is transparent to the wavelength of the laser light emitted from the active layer 4B. Because, the absorption of laser light in the second optical guiding layer 6B results in heat generation in close to the active layer 4B, adversely affecting the life of the semiconductor laser device. Generally, the energy band gap of the second optical guiding layer 6B is taken as larger than the energy of wavelength. That is, between X1 and X2 in each mixed crystal ratio of the active layer 4B indicated by $In_{x1}Ga_{1-x1}N$, and the second optical guiding layer 6B indicated by $In_{x2}Ga_{1-x2}N$, the relationship: X1>X2 shall be satisfied. However, when the second optical guiding layer 6B is so thin as to become transparent to energy of the wavelength of laser light, that is, the thickness of the second optical guiding layer 6B is so thin as to produce a quantum effect, it may be that X1≦X2. In this case, the difference in level in etching becomes smaller, resulting in easier process.

The materials for the second optical guiding layer 6B is not limited to InGaN, but, for example, AlGaN may be used which is the same material as that for the buried cladding layer 7B. In this case, the difference in lattice constant due to the difference in material becomes small, resulting in easier crystal growth. This allows excellent crystal growth. Also, since AlGaN has a larger energy band gap than InGaN, the second optical guiding layer 6B becomes transparent to laser light. However, the refractive index of the second optical guiding layer 6B is required to be larger than that of the buried cladding layer 7B in order to obtain a real refractive index-guided structure. Therefore, between Z2 and Z3 in each mixed crystal ratio of the second optical guiding layer 6B indicated by $Al_{Z2}Ga_{1-Z2}N$, and the buried cladding layer 7B indicated by $Al_{Z3}Ga_{1-Z3}N$, it is necessary that the relationship: Z3>Z2 is satisfied.

Also, for current confinement, it is preferable that the first optical guiding layer 5B is more likely to be subjected to surface oxidation than the second optical guiding layer 6B. Therefore, the mixed crystal ratio of the first optical guiding layer indicated by $Al_{Z1}Ga_{1-Z}N$ shall be Z1>Z2.

Further, by constructing the active layer 4B so as to have a quantum well structure, a semiconductor laser device can be implemented which causing oscillation of high output power blue laser light at lower threshold current value. InN, InGaN, or the like is used for the well layer and barrier layer of the quantum well structure. As the structure thereof, a structure such as Single Quantum Well (SQW) structure, Double Quantum Well (DQW) structure, Triple Quantum Well (TQW) structure, Graded-Index (GRIN) structure or Separate Confinement Heterostructure (SCH) thereof is used.

Also in this case, it is desirable that the second optical guiding layer 6B is transparent to the wavelength of laser light as in the foregoing. In order to obtain a real refractive index-guided structure and current confinement mechanism when the second optical guiding layer 6B is formed with AlGaN, the above-described relationship is also required between the mixed crystal ratios of the first optical guiding layer 5B, second optical guiding layer 6B, and buried cladding layer 7B, as in the foregoing.

We claim:

1. A method for producing a semiconductor laser device, comprising the steps of:

forming an active layer on a semiconductor substrate;

forming a first optical guiding layer of one conductivity type made of $Ga_{1-y1}Al_{y1}As$ on said active layer by means of epitaxial growth;

forming a second optical guiding layer of one conductivity type made of $Ga_{1-y2}Al_{y2}As$ on said first optical guiding layer;

etching said second optical guiding layer so as to have a stripe structure; and forming a cladding layer of one conductivity type made of $Ga_{1-y3}Al_{y3}As$ on said first optical guiding layer and said second optical guiding layer by means of epitaxial growth, so that between Y1 and Y3 of each AlAs mole fraction of said $Ga_{1-y2}Al_{y2}As$ and said $Ga_{1-y3}Al_{y3}As$, the relationship of Y3>Y2 is satisfied.

2. A method for producing a semiconductor laser device, comprising the steps of:

forming an active layer on a semiconductor substrate;

forming a first optical guiding layer of one conductivity type made of $Ga_{1-y1}Al_{y1}As$ on said active layer by means of epitaxial growth;

forming a second optical guiding layer of one conductivity type made of $Ga_{1-y2}Al_{y2}As$ on said first optical guiding layer;

etching said second optical guiding layer so as to have a stripe structure;

oxidizing the surface layer of regions not in contact with said second optical guiding layer in said first optical guiding layer; and forming a cladding layer of one conductivity type made of $Ga_{1-y3}Al_{y3}As$ on said first optical guiding layer and said second optical guiding layer by means of epitaxial growth, so that between Y2 and Y3 of each AlAs mole fraction of said $Ga_{1-y2}Al_{y2}As$ and said $Ga_{1-y3}Al_{y3}As$, the relationship of Y3>Y2 is satisfied.

3. A method for producing a semiconductor laser device, comprising the steps of:

forming an active layer on a semiconductor substrate;

forming a first optical guiding layer of one conductivity type made of AlGaN on said active layer by means of epitaxial growth;

forming a second optical guiding layer of one conductivity type made of InGaN on said first optical guiding layer;

etching said second optical guiding layer so as to have a stripe structure; and forming a cladding layer of one conductivity type made of AlGaN on said first optical guiding layer and said second optical guiding layer by means of epitaxial growth.

4. A method for producing a semiconductor laser device, comprising the steps of:

forming an active layer on a semiconductor substrate;

forming a first optical guiding layer of one conductivity type made of AlGaN on said active layer by means of epitaxial growth;

forming a second optical guiding layer of one conductivity type made of InGaN on said first optical guiding layer;

etching said second optical guiding layer so as to have a stripe structure;

oxidizing the surface layer not in contact with said second optical guiding layer in said first optical guiding layer; and forming a cladding layer of one conductivity type made of AlGaN on said first optical guiding layer and said second optical guiding layer by means of an epitaxial growth technique.

5. A method for producing a semiconductor laser device, comprising the steps of:

forming an active layer on a semiconductor substrate;

forming a first optical guiding layer of one conductivity type made of $Al_{Z1}Ga_{1-Z1}N$ on said active layer by means of an epitaxial growth technique;

forming a second optical guiding layer of one conductivity type made of $Al_{Z2}Ga_{1-Z2}N$ on said first optical guiding layer;

etching said second optical guiding layer so as to have a stripe structure; and forming a cladding layer of one conductivity type made of $Al_{Z3}Ga_{1-Z3}N$ on said first optical guiding layer and said second optical guiding layer by means of an epitaxial growth technique, so that between Z2 and Z3 of each AlN mole fraction of said $Al_{Z2}Ga_{1-Z2}N$ and said $Al_{Z3}Ga_{1-Z3}N$, the relationship of Z3>Z2 is satisfied.

6. A method for producing a semiconductor laser device, comprising the steps of:

forming an active layer on a semiconductor substrate;

forming a first optical guiding layer of one conductivity type made of $Al_{Z1}Ga_{1-Z1}N$ on said active layer by means of an epitaxial growth technique;

forming a second optical guiding layer of one conductivity type made of $Al_{Z2}Ga_{1-Z2}N$ on said first optical guiding layer;

etching said second optical guiding layer so as to have a stripe structure;

oxidizing the surface layer of the region not in contact with said second optical guiding layer in said first optical guiding layer; and forming a cladding layer of one conductivity type made of $Al_{Z3}Ga_{1-Z3}N$ on said first optical guiding layer and said second optical guiding layer by means of an epitaxial growth technique, so that between Z2 and Z3 of each AlN mole fraction of said $Al_{Z2}Ga_{1-Z2}N$ and said $Al_{Z3}Ga_{1-Z3}N$, the relationship of Z3>Z2 is satisfied.

* * * * *